(12) United States Patent
Kumar et al.

(10) Patent No.: US 9,006,028 B2
(45) Date of Patent: Apr. 14, 2015

(54) METHODS FOR FORMING CERAMIC SUBSTRATES WITH VIA STUDS

(76) Inventors: Ananda H. Kumar, Fremont, CA (US);
Ashish Asthana, Fremont, CA (US);
Farooq Quadri, San Ramon, CA (US)

( * ) Notice: Subject to any disclaimer, the term of this patent is extended or adjusted under 35 U.S.C. 154(b) by 807 days.

(21) Appl. No.: 12/558,490

(22) Filed: Sep. 11, 2009

(65) Prior Publication Data

US 2010/0068837 A1   Mar. 18, 2010

Related U.S. Application Data

(60) Provisional application No. 61/096,315, filed on Sep. 12, 2008.

(51) Int. Cl.
| | |
|---|---|
| *H01L 21/00* | (2006.01) |
| *G01R 1/04* | (2006.01) |
| *H05K 3/40* | (2006.01) |
| *G01R 3/00* | (2006.01) |
| *H05K 1/11* | (2006.01) |
| *H05K 3/46* | (2006.01) |

(52) U.S. Cl.
CPC .............. *G01R 1/0491* (2013.01); *G01R 3/00* (2013.01); *H05K 1/111* (2013.01); *H05K 3/4007* (2013.01); *H05K 3/4629* (2013.01); *H05K 2201/0367* (2013.01); *H05K 2203/308* (2013.01); *H01L 2224/16225* (2013.01); *H01L 2924/15312* (2013.01); *H01L 2924/0002* (2013.01)

(58) Field of Classification Search
CPC .............. H01L 2224/16225; H01L 2924/00; H01L 2224/32225; H01L 2924/15311; H01L 2224/48227; H01L 2224/73265; H01L 23/49822; H01L 23/53295; G01R 1/06711; G01R 1/06727

USPC ............... 438/612, 618, 17, 106, 624; 257/E21.575, E21.529
See application file for complete search history.

(56) References Cited

U.S. PATENT DOCUMENTS

| | | | |
|---|---|---|---|
| 4,301,032 A | 11/1981 | Atkinson et al. | |
| 4,784,972 A | 11/1988 | Hatada | |
| 4,880,064 A | 11/1989 | Willoughby et al. | |
| 4,952,272 A | 8/1990 | Okino et al. | |
| 5,456,778 A * | 10/1995 | Fukuta et al. ............... | 156/89.17 |
| 5,811,982 A | 9/1998 | Beaman et al. | |
| 5,929,651 A | 7/1999 | Leas et al. | |
| 5,994,152 A | 11/1999 | Khandros et al. | |
| 6,555,906 B2 | 4/2003 | Towle et al. | |

(Continued)

FOREIGN PATENT DOCUMENTS

JP     2005247689    *   9/2005

OTHER PUBLICATIONS

International Seach Report and Written Opinion—PCT/US2009/056761, Mar. 12, 2011.

(Continued)

*Primary Examiner* — Duy T Nguyen

(57) ABSTRACT

This document describes the fabrication and use of multilayer ceramic substrates, having one or more levels of internal thick film metal conductor patterns, wherein any or all of the metal vias intersecting one or both of the major surface planes of the substrates, extend out of the surface to be used for making flexible, temporary or permanent interconnections, to terminals of an electronic component. Such structures are useful for wafer probing, and for packaging, of semiconductor devices.

20 Claims, 19 Drawing Sheets

(56) References Cited

U.S. PATENT DOCUMENTS

| | | | |
|---|---|---|---|
| 6,889,433 B1* | 5/2005 | Enomoto et al. | 29/852 |
| 7,067,356 B2 | 6/2006 | Towle et al. | |
| 8,205,330 B2* | 6/2012 | Zhang et al. | 29/852 |
| 2001/0052590 A1* | 12/2001 | Ishida | 252/500 |
| 2005/0151303 A1* | 7/2005 | Konishi et al. | 264/618 |
| 2006/0121690 A1 | 6/2006 | Pogge et al. | |
| 2006/0231290 A1* | 10/2006 | Kariya et al. | 174/258 |
| 2006/0234021 A1* | 10/2006 | Tanei et al. | 428/210 |
| 2006/0278998 A1 | 12/2006 | Pogge et al. | |
| 2007/0108586 A1* | 5/2007 | Uematsu et al. | 257/690 |
| 2007/0216019 A1 | 9/2007 | Hsu | |
| 2007/0266886 A1* | 11/2007 | En et al. | 106/1.18 |
| 2008/0043447 A1 | 2/2008 | Huemoeller et al. | |

OTHER PUBLICATIONS

Itagaki et.al. 'a co-fired bump bonding technology for chip scale package', 1997 international symposium on microelectronics : (Philadelphia PA, Oct. 14-16, 1997).

1. Thomas DiStefano, 'Infrastructure for wafer level packaging', Presented at the Wafer-level Infrastructure Conference. Semicon 2000.

2. Kuntz (Reference: ISHM '91 Proceedings High performance test socket system for 35 mm TAB devices).

R. Albrecht, et.al, 'Microfabrication of cantilever styli for the atomic force microscopes' in J. Vac. Sci. Technol. A8 (4) Jul./Aug. 1990, pp. 3386-3396.

* cited by examiner

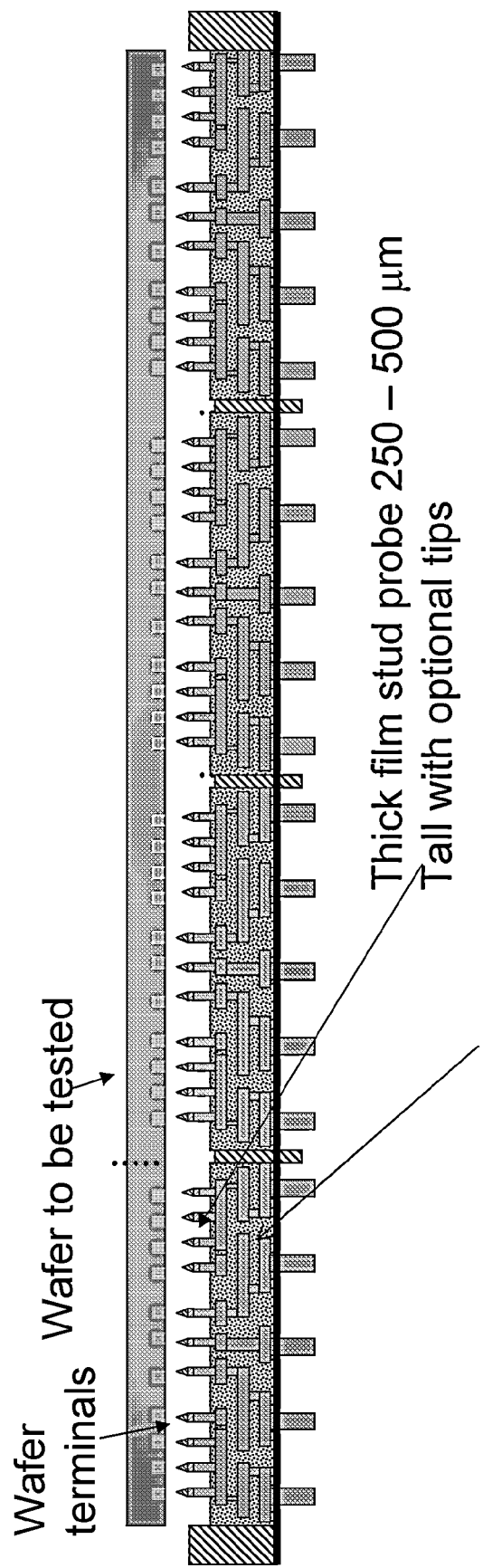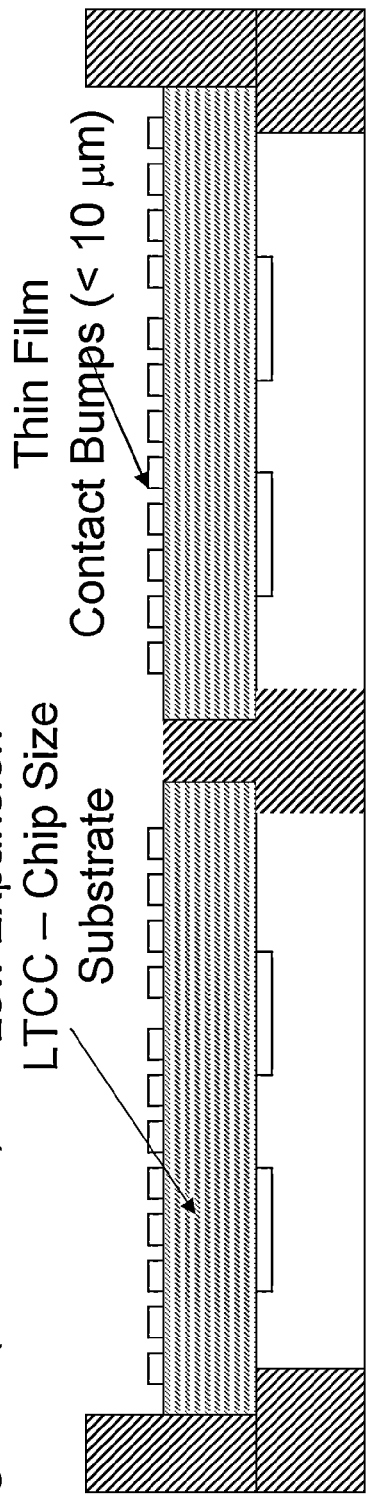
Fig. 8A
Fig. 8B (Prior Art)
Prior Art Probe Assembly

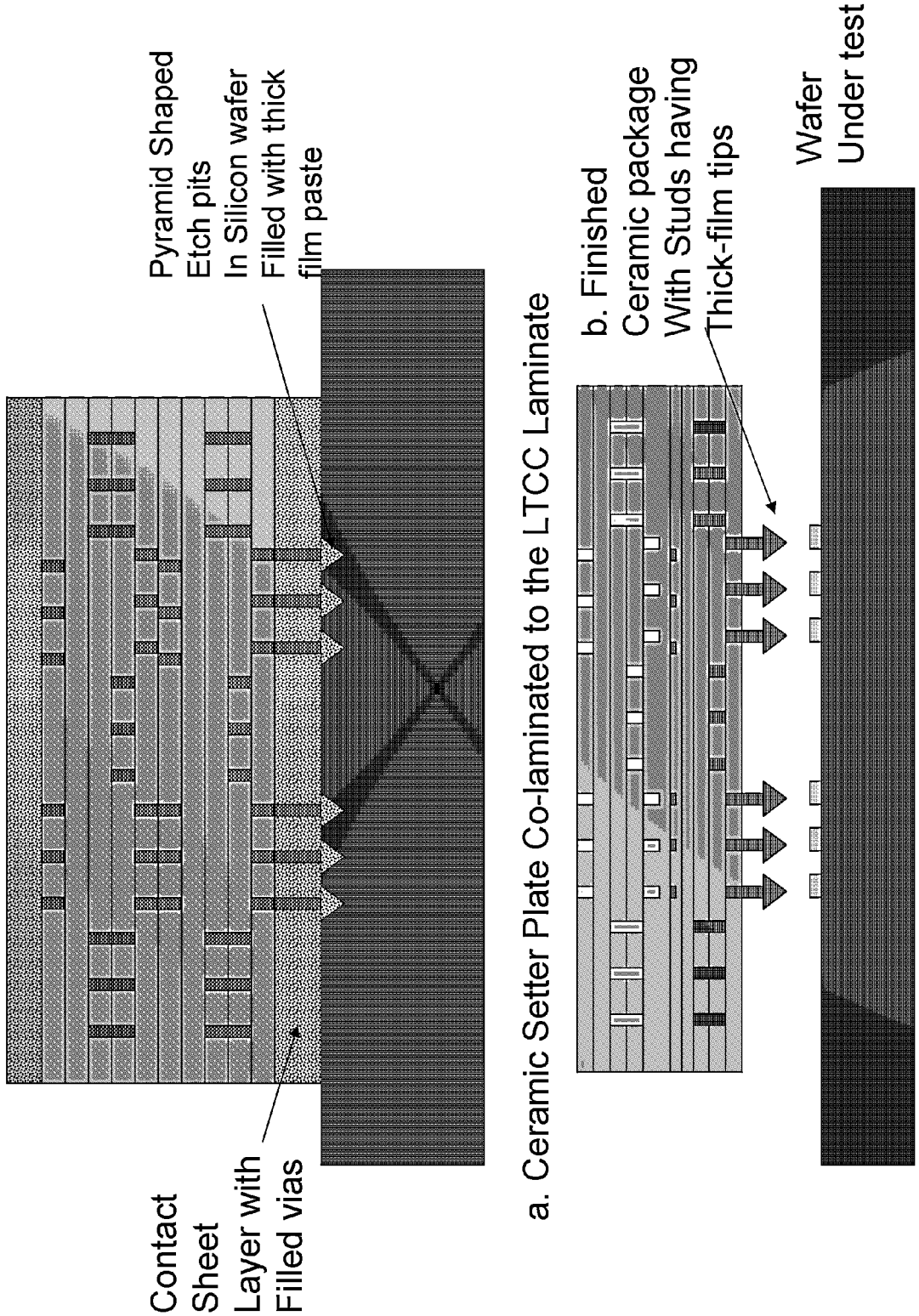

115

131

132

115

191   192

METHODS FOR FORMING CERAMIC SUBSTRATES WITH VIA STUDS

The present application claims priority from the provisional patent application, Ser. No. 61/096,315, filed on Sep. 12, 2008, titled "Structures and Methods for Wafer Packages, and Probes", hereby incorporated by reference.

BACKGROUND

The semiconductor technology has been following Moore's' law relentlessly over the past two decades, with device densities now containing several million transistors. This has translated into ever increasing challenges in testing and packaging of these devices due to greatly increased need for input/output (I/O) terminal pads and decreased pad size and spacing. The leading-edge pad pitches and sizes are under 50 μm, a limiting value for wirebond technology. This has hastened the migration to area array solder bump, or flip chip bonding, which accommodates increased number I/O pads, significantly relaxing the pad size and density constraints for many memory devices. For ASICs and microprocessor type devices, number of area array I/Os numbers, have routinely exceeded a thousand pads on a single device or chip, requiring ever smaller pad sizes and pitches, currently reaching 75 μm pads on 150 μm, respectively. The area array technology brings its own unique challenges in processing, package reliability, and testing. Added to these are the challenges to reduce the costs in device fabrication, testing, and packaging.

These challenges have been met though technological innovations in testing and packaging, materials, and structures. For packaging, the industry has developed low cost flip chip bonding substrates shown in FIG. 1.

Flip chip solder interconnection, also called Controlled Collapse Chip Connection or C4, for short, was first introduced by IBM more than 30 years ago. Kumar et. al. (U.S. Pat. No. 4,301,324) developed ceramic substrates of nearly same coefficient of thermal expansion, (CTE), as the device chip, allowing for very highly reliable solder connections. Today's lower cost flip chip packages are made from plastic packages with high Coefficient of Thermal Expansion (CTE). In recent years the rest of the industry has also widely adopted this method of interconnection for connecting the chip directly to the board, inviting serious reliability problems involving fatigue failures in the solder joints. Adoption of flip chip, area array terminals for even low I/O devices has enabled packaging these devices on the wafer itself, thorough the so called Wafer Level Packaging, (WLP), methods, greatly reducing cost.

Reliability of flip chip solder joints to second level packages such as printed wiring boards, (PWB), is a serious concern, and becoming more so as the pad sizes decrease. One widely adopted mitigation strategy to enhance solder joint reliability is to use a polymer fill under the chip (so called 'underfill), entailing extra costs for process, materials, equipment, and yield loss. Another strategy, just coming into use, particularly for microprocessor device chips, is the so-called 'copper bumps', once again adding cost and complexity. This concern seriously jeopardizes the migration to smaller pad sizes pitches projected by the industry. While they add much cost and process complexity, these measures only improve fatigue life by less than a third.

Industry has also developed a versatile vertical probe technology using discrete metal wires, so-called COBRA probes, to test these area array chips. The increased numbers, densities, decreased sizes of area-array pads on device chip have brought about a commensurate need for new vertical probe technologies. Available vertical probe technologies are complex, expensive, and delicate. The introduction of microfabricated cantilever probes has met the challenges in testing the closely spaced, smaller wirebond pads. The so-called multi-DUT probes constructed from these have enabled greatly increased productivity though their ability to contact many dies simultaneously i.e. increased 'test parallelism'.

One common method to form arrays of vertical probes is to attach metal wire extensions to the co-planar pads on the surface of substrates, same ones used for packaging the dies. The wire extensions are essentially truncated gold wire bonds formed on the gold plated substrate pads. The package provides the necessary electrical connections to the 'wire probes', routing them to conveniently spaced and located interconnection terminal pads used to join to the next level of interconnection, such as a printed wiring board, (PWB). This routing can be either to pads located on the same side of the central probe array, i.e. co-planar routing or, as is more common, to the opposite surface of the surface of the package. In this context, the package is often referred to as the 'space transformer' because, invariably, the pad spacing of the terminal pads are much wider than that of the probe array. In this document the terms substrates and space transformers are used interchangeably. The space transformers are generally made of ceramic packages, often multi-layer ceramic packages with several levels of internal wiring, terminating on both the probe side and the 'board side', in co-planar pads that may be plated with nickel and gold. To form the probe array, soft gold wires are ultrasonically bonded to the pads, and specially shaped before truncating and planarizing the tops. The soft gold wires may be stiffened by coating with polymer, or with nickel alloys. Special tips and 'electro-formed' arrays of cantilever beams of a suitable metal alloy are attached to the ends of the probes from wafer templates. Yet another method for forming probes involves building probe arrays on space transformers by lithographically patterned and plated thin films. Here, multiple plating steps are needed to obtain probe structures sufficiently tall, often as much as 0.5 -to 2 mm, to overcome the global and local positional variations in the locations of the test pads on the wafers. Such microfabrication methods, can be carried out either right on the space transformer, or fabricated separately and transferred to the space transformer. The wire-bond probes and the micro fabricated probes are both delicate structures, which when bent or broken, are hard to repair or replace. Invariably, the probe cross-sections in these structures are significantly smaller than the diameters of the pads on the space transformer to which they are joined. Also they are adhered to the pads of the space transformer over-plating a hard metal on the base or joined with solder or braze. For these reasons, multi-Device Under Test (DUT) probes are fragile and, expensive.

In the prior art wafer probe structures discussed above, the process complexities, and the high fabrication costs, are the direct result of the need to elevate the probe tips significantly above the surface of the space transformer. This, in turn, is dictated by the requirement for the probe tips to bend and conform to the thousands of test pads on a wafer, compensating for the expected variations in probe heights, i.e. planarity, and variations in the wafer thickness, in pad sizes, locations, together adding up to 100-500 microns. Depending on the size of the probe array, the probe heights required to compensate for these factors can range from 25 μm, for a single DUT, area-array probe, to 500 μm for a multi-DUT probe. Some bending or compliance of the probe is also required to provide a level of 'scrub' needed to break though oxide formed on the wafer terminals. Sophisticated probe array positioning and tilting schemes can decrease these heights, somewhat.

SUMMARY

The present invention relates generally to methods and apparatuses for semiconductor chip packaging and testing, such as ceramic packages or ceramic probes for device testing. In an embodiment, the present invention discloses a contactor for semiconductor chips, and methods for fabricating the contactor. The present contactor comprises a plurality of via extensions, protruding from the top and bottom surfaces of the contactor. The via extensions have aspect ratio higher than 2×1, for example, to compensate for the height mismatched between via extensions. In an aspect, the diameter of the via extensions is less than 500 microns, and preferably less than 100 microns. These via extensions are designed to be bonded to the bond pads of the semiconductor chips, for example, by soldering. Thus the size of the via extensions is preferably less than the bond pads' dimension. Soldering provides a potential alignment between the via extensions on the contactor and the bond pads on the semiconductor chips.

In an embodiment, the present contactor comprises a plurality of via extensions having contact tips fabricated from a semiconductor wafer. By fabricating the contact tips on a semiconductor wafer, the via extensions of the contactor can have the accuracy of semiconductor processing and the planarity of semiconductor wafer. The bonding between the via extensions and the contact tips can be accomplished by soldering, which can accommodate minor mis-alignment. In an aspect, a releasable layer is coated on a semiconductor wafer before the contact tips are formed, for example, by patterning and depositing. After bonding the via extensions to the contact tips, the releasable layer is released, freeing the contact tips from the semiconductor wafer.

In an embodiment, the present contactor comprises a plurality of via extensions having constricted solder bridge to allow ease of rework. The constricted solder bridge limits the amount of solder between the via extensions and the bond pads, thus providing a solid electrical connection between the contactor and the chip, and at the same time, providing a minimum soldering required to allow ease of removal. In an aspect, the constricted solder bridge comprises a coating, e.g., a polyimide coating, on the surrounding sides of the via extensions, preventing soldering to be attached to these sides. Thus the solder only attaches to the tip of the via extensions, or a portion of the top surface of the via extensions. In this case, after re-heating, the contactor and the chip can be separate with relative ease.

In an embodiment, the present invention discloses a chip package comprising a contactor having a plurality of via extensions solderingly bonded to the bond pads of one or more semiconductor chips. The use of soldering bonding allows the compensation for minor mis-alignment, both in lateral dimensions and in vertical dimension.

BRIEF DESCRIPTION OF THE DRAWINGS

FIG. 8A illustrates an assembled probe package.

FIG. 8B illustrates a prior art probe assembly.

FIG. 9 illustrates an exemplary process of forming studs with co-fired tips

DETAILED DESCRIPTION OF EMBODIMENTS OF THE INVENTION

Figure 1:
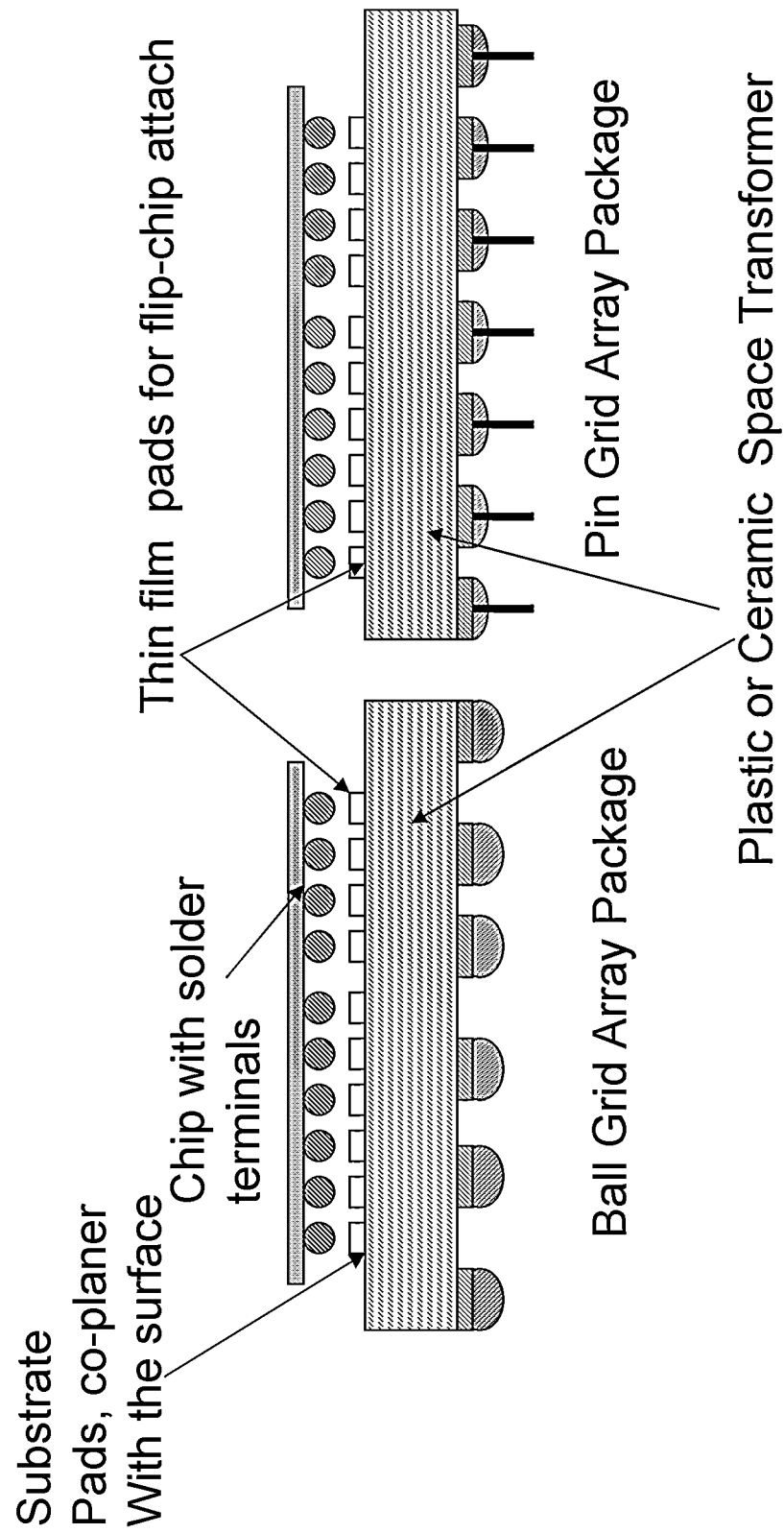
FIG. 1 illustrates prior art chip bonding.
Figure 2:
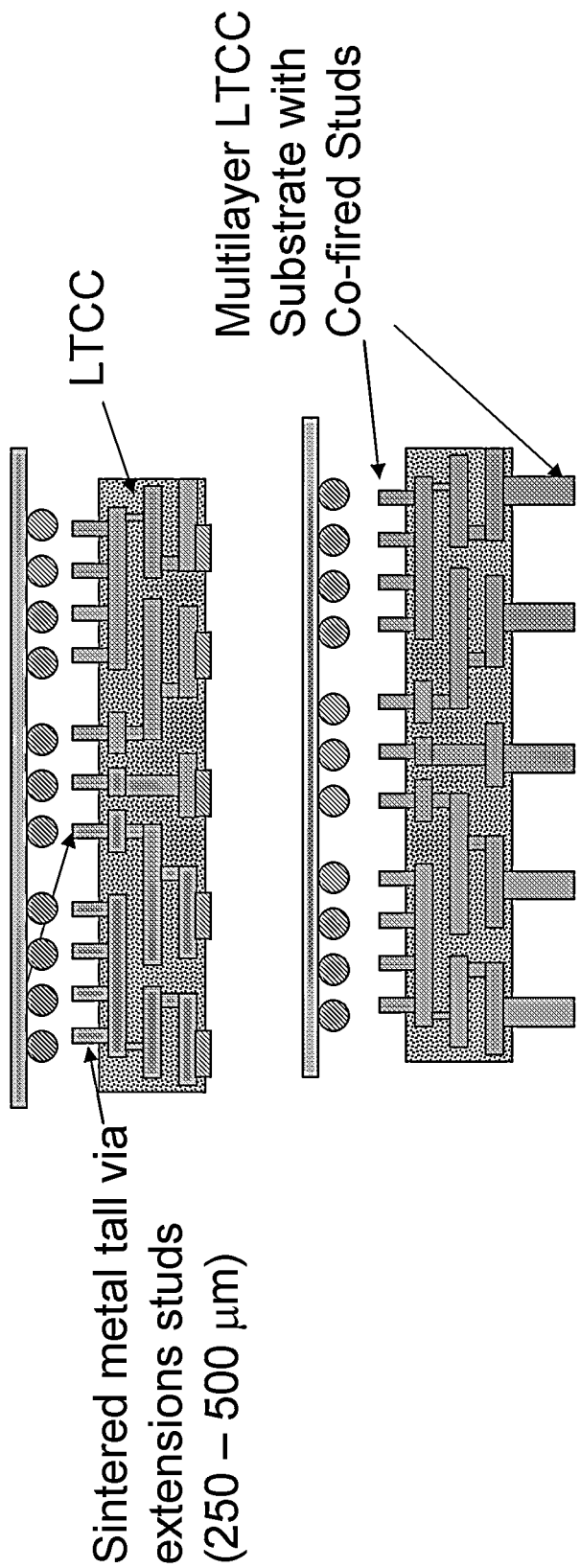
FIG. 2 illustrates an exemplary chip size package to make permanent or temporary interconnections to devices with solder terminals.

This invention in several of its embodiments addresses the twin challenges posed by today's high density flip chip devices, viz. need for, (1) packaging technology that provides highly reliable solder joints in flip chip device packaging, and, (2).vertical probe arrays that are rugged, inexpensive, simple, and scalable. The common element for achieving these goals is a multilayer ceramic (MLC) substrate, having a coefficient of thermal expansion, CTE well matched to that of silicon, and having co-formed via extensions, or via studs illustrated in FIG. 2. The methods for fabricating these CTE-matched substrates also lends itself to fabricating them on product wafers, to obtaining great benefits to semiconductor manufacturers in wafer-level testing, burnin, and packaging.

In prior art, such co-formed or co-fired metal studs have been use, in one instance (D. Boss, A. Kumar et. al., U.S. Pat. No. 4,880,684), to translate the thin-film metal pads of the substrate thorough a soft polymer layer, upon which thin film pads are formed. The soft polymer layer shields the weak ceramic from cracking, due to the combined stresses of the thin film pad, and the solder joint to the chip terminals that sits on the pads. This entails high costs associated with coating a thick polymer layer over the studs, planarizing to expose the tops of the studs and thin film deposition and patterning of the terminal pads for solder attachment.

In another instance, (Itakagi, et. al. Intl. J. Microelectronics, pp. 46-51, 1997) similarly co-formed studs are used to make permanent, low stress, direct electrical connection to I/O pads of the chip, using soft conductive adhesives. The via studs are short, and the CTE of the substrate is not required to be matched to that of silicon. Such conductive adhesives have poor electrical conductivity, high contact resistance, and are not reliable in long term usage. Also, flip-chip conductive adhesive joining, unlike flip-chip solder joining, lacks the ability for self-alignment, necessitating precise die placement during joining. The structure of this prior art also requires additional reinforcement of the conductive adhesive joints in the form of a resin underfill layer, further adding cost and complexity.

The structures and methods of this invention are aimed at avoiding the complexity, cost, performance and reliability issues with conformed via stud structures, and of their use, in the above cited prior art methods. These via studs are merely extensions of thick film copper or silver vias from one or more layers of the substrate and are connected to Input/ output (I/O), pads on the other side by redistribution lines. The via studs of this invention can be used for forming dense arrays of, flexible, low stress interconnections to silicon devices by flip chip soldering. The flexibility of the studs and the silicon CTE-matched ceramic in which they are rooted, make it possible to have high reliability, flip-chip solder interconnections.

These via studs, or hereinafter referred to simply also as studs, can also be used as flexible, elongated probes in wafer probing. By co-forming the studs during the substrate fabrication, the extra expense of wire attach, or micro-fabrication methods used for forming such elevations, are avoided here. The studs can be made sufficiently long, ranging from 25 μm to 1000 μm, longer if needed, to provide the necessary elevation to the probe tips to satisfy the planarity and compliance required for probe arrays to simultaneously contact all the test pads across a multiplicity of devices, across the whole wafer. The preferred range of the heights of the studs is from 50 μm to 250 μm. These studs, which are of the same diameter as the buried vias, will be quite rugged unlike the wire-bond formed probes of prior art. The probes of prior art, which are joined to the corresponding pads of the space transformer by weak gold-to-gold bonding, and require reinforcing in the form of over-plating, or solder coating the bond area. In contrast, the stud probes of this invention will be well anchored to the vias within the ceramic.

In the wafer probe application, these studs can be provided with special metal tips, using a silicon wafer as the template for the test pad tips, by flip-chip solder method that will naturally assure a high degree of co-planarity, and lateral positional accuracy for the probe tips. Here the self-aligning ability of flip chip solder interconnections is used to achieve this.

Other embodiments of this invention provides method for fabrication of these space transformers, and methods for using these for either testing, packaging, or for both. Such space transformers are also useful for diced single device chips, or for wafer-level testing and assembly.

Fabrication of Ceramic Substrates with Via-Studs:

Multilayer ceramic, (MLC), substrates have been in use for packaging single, and multiple chips for sometime. The most common method for their fabrication uses 'green tapes' for forming ceramic layers and thick film inks or pastes for forming conducting patterns in the layers, and layer-to-layer interconnections, commonly referred to as vias. The 'green tape' is made by casting a paint-like slurry containing powders of a suitable ceramic and glass, with a polymeric binder dissolved in organic solvents, on a polymer film such as Mylar TM by the so called doctor blade method. Examples of polymeric binders are butadiene, or Butvar TM, Poly-methyl methacrylate (PMMA). Mixtures of alcohols, such as Isopropyl alcohol, (IPA), and methanol, or ketones such as methyl iso-butylketones (MIBK) are common solvents and vehicles for the slurry. After the solvents evaporate, the, the paper thin and, rubbery green tape, now consisting ceramic and glass particles in a matrix of the polymeric binder, is cut or 'blanked' to size with alignment holes at the corners. Via holes are punched at the required locations by automated mechanical methods using a programmable die and punch set, or by laser drilling. The conductor patterns are printed on to the green tape layers, using screens or stencils cut in metal foil, and the via holes are also filled with the same or similar conductor inks. The green tape layers are stacked in the required order and in good alignment between the layers, and laminated at a temperature of about 100° C., and pressures of between 250-1000 psi. in a laminating press, to obtain a monolithic 'green laminate'. The green laminate is then 'sintered' by a programmed heating regimen, in suitable furnace ambient, first to completely remove the polymeric binder, and subsequently to sinter the ceramic powder, the metal particles in the conductor lines and vias, to obtain a monolithic sintered ceramic substrate with interconnected, buried and surface conductor patterns.

Figure 3:
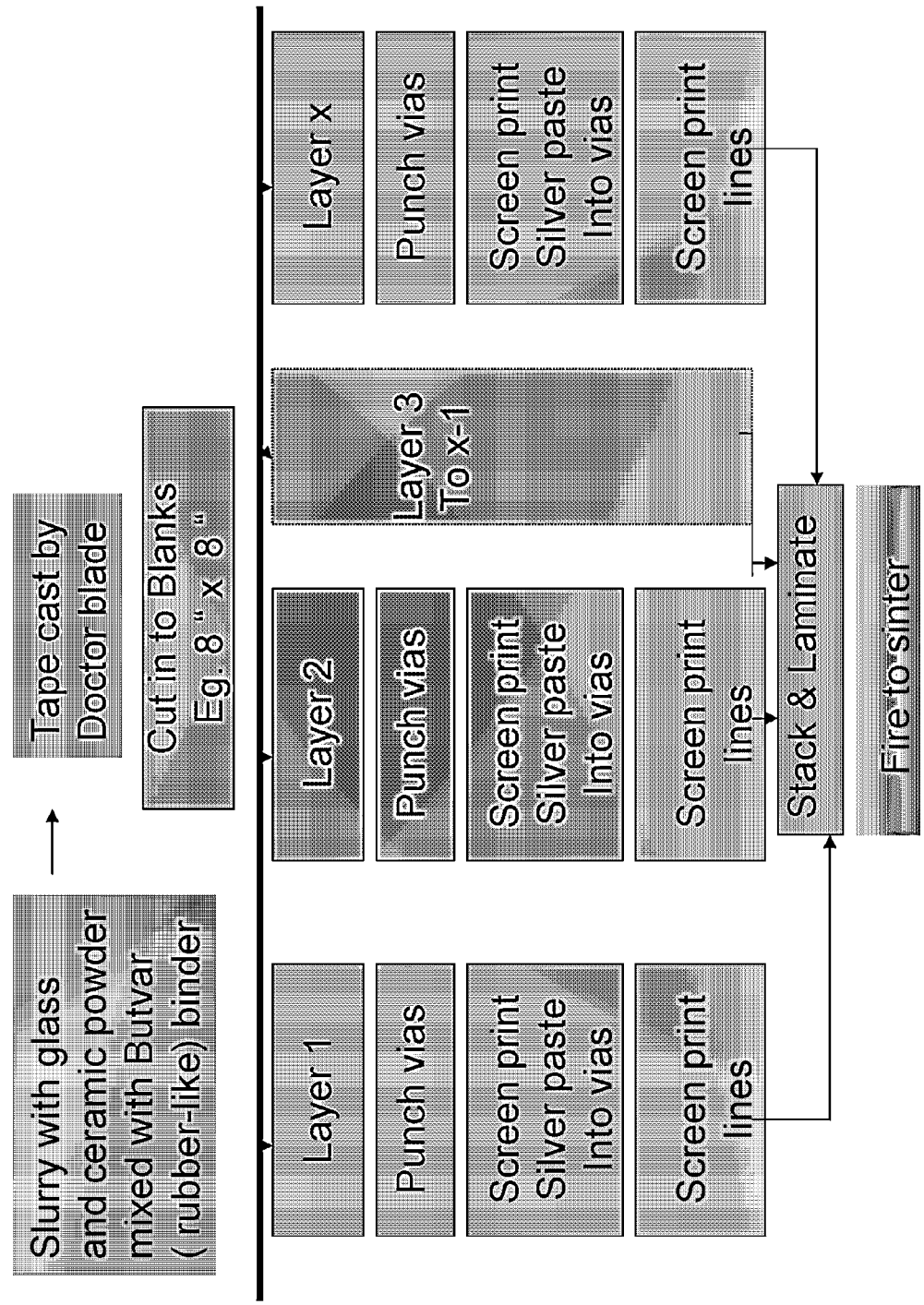
FIG. 3 illustrates an exemplary LTCC process flow.

Commonly used ceramic powder in multilayer substrates is alumina, which would constitute from 80-96% by weight in the green tape with certain alkaline earth alumino-silicate glasses the remainder. When alumina is used as the ceramic, its high sintering temperatures requires the use of molybdenum or tungsten inks to form the conductors. The steps involved in the fabrication of such multilayer substrates are shown in FIG. 3. A good description of such multilayer substrates, including a detailed description of the steps in their fabrication, is given by in "Microelectronic Packaging" by A. R. Blodgett & D. R. Barbour, Scientific American, V 249 (1), pp 86-96 (1983). Because of the high temperatures (>1400° C.) involved in the fabrication, this technology is commonly referred to as High Temperature Co-fired Ceramic, (HTTC) technology.

Certain special glass compositions whose powders sinter well between 800° C.-1000° C., while simultaneously becoming crystalline, are useful in fabricating a lower temperature version of this technology in order to enable the incorporation highly conductive thick film metallurgy of copper, silver, or gold. Compositions consisting of physical mixtures of ceramic powders, usually alumina, with significant volume fraction of glasses that soften and flow at temperatures well below 1000° C. are also used for fabricating such multilayer structures. This technology for fabricating multilayer structures at these relatively lower temperatures to be compatible with thick film inks of silver, copper or gold, is commonly referred to as Low Temperature Co-fired Ceramic (LTCC) technology.

The total shrinkage of the green laminate on the way to full densification is about 50% by volume. In the prior art, a method for sintering LTCC substrates that completely suppresses the lateral (x, y) shrinkage of the substrates, forcing the entire shrinkage of the green laminate to take place in the Z- or thickness direction, involves using a green tape layer consisting of a refractory ceramic such as alumina, that is co-laminated to the top and bottom of the LTCC green laminate. We shall refer to the green tape layer containing the inert ceramic powder as the 'contact sheet'. During sintering of the LTCC substrate, in the temperature range of 800° C.-1000° C., the ceramic powder in the topmost and bottommost contact sheet layers, does not densify and, thereby, prevents the lateral shrinkage of LTTC layers in between. This, in turn, forces the LTCC layers to densify totally in the z, or thickness direction. After the substrate is fully sintered and cooled, the inert contact layers, now reduced to a loose agglomeration of the inert ceramic powder, can be easily removed with a jet of water or air and the LTCC substrate is finished with plating or other operations for use as packages for semiconductor devices.

The via extensions are formed as follows: the inert contact layer for the top side is provided with the same filled via pattern as the topmost LTCC green tape layer, and co-laminated top most LTCC layer along with the rest of the green laminate. After the LTCC substrate is fully sintered, the inert ceramic layers are removed by blowing off with a jet of air or of water. This exposes the 'via-extensions' or 'studs' attached firmly to the vias emerging from topmost layer of the LTCC substrate. The height of the stud will generally end up to be about 50% of the thickness of the contact sheet in the green state, which typically ranges from 50 .mu.m to 250 .mu.m. The resulting metal studs will have a uniform height, which can range from 25 .mu.m to 125 .mu.m, depending on the thickness of the green sheet used for the contact layer. To obtain even taller studs, more than one green tape contact sheets with paste-filled vias, are co-laminated to the LTCC layers tape layers. Staggered stud structures 499 can be obtained by slightly displacing the vias in the contact sheets to a little extent (see FIG. 4). Even cantilever structures can be produced by using multiple contact sheet layers and printing the cantilever part of the structure on its surface and connected to the stud via. After the substrates are sintered the ceramic powder of the contact layer is washed off or blown-off without damaging the studs standing proud of the LTCC surface.

Figure 4:
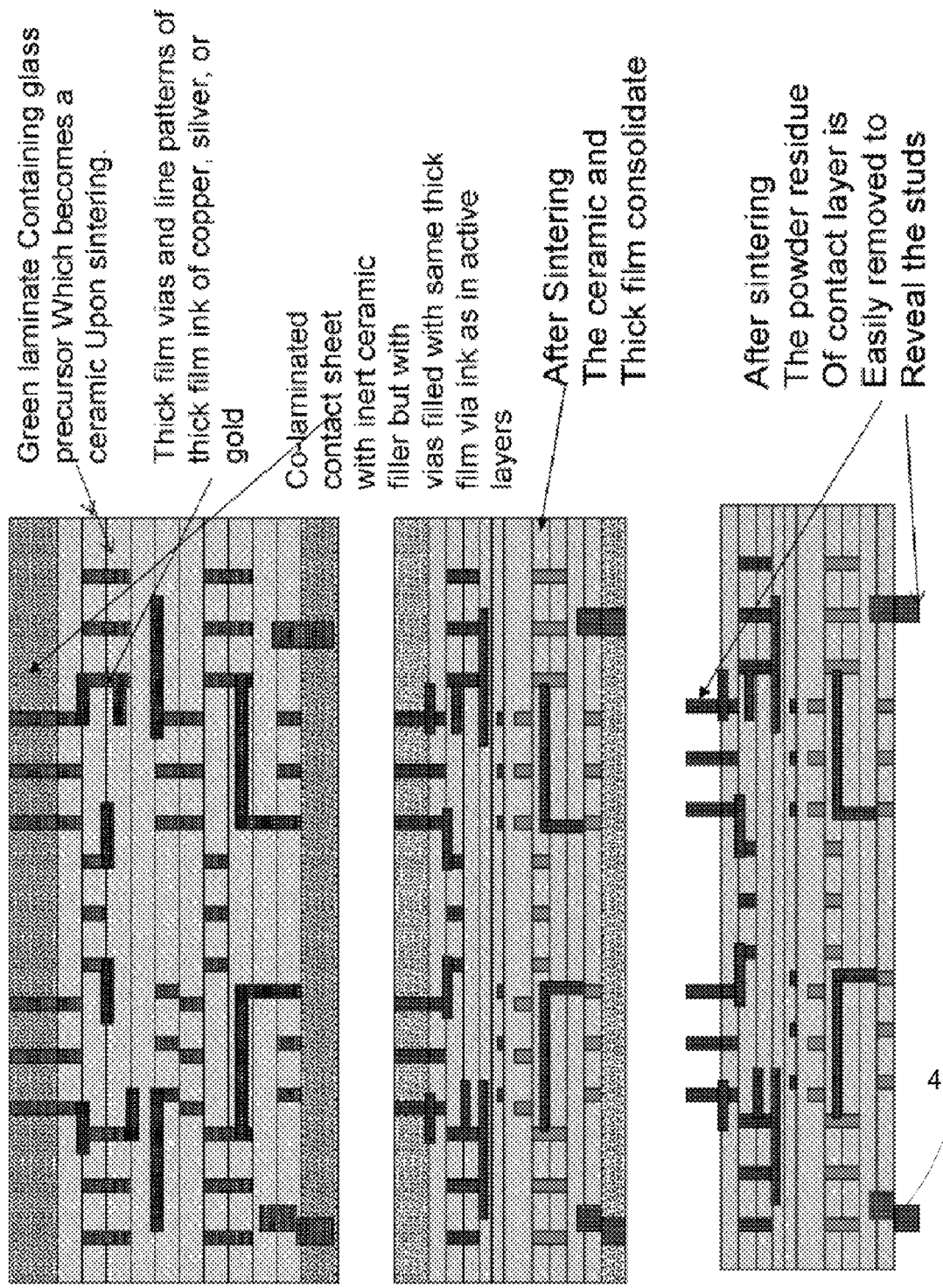
FIG. 4 illustrates an exemplary process of forming packages with via extensions.

The same can be done to the bottom contact sheet of the green laminate to obtain via extensions there as well (FIG. 4). The inert contact sheet layers on the opposite side can also be utilized as above for forming studs. Generally the numbers of I/Os needed on the 'board side' are significantly smaller than on the device side, thereby allowing for longer and larger diameter studs to be provided on this side. These studs would allow for easy electrical contact for testing and burn-in and very reliable permanent terminal for board attachment with reflow soldering methods. In all the application examples to follow, the backside studs are shown, but it should be understood that other forms of backside terminals such as thick film or thin film metal pads, ball grid arrays, soldered or brazed pins, etc. are equally applicable. In the description of our invention that follows, we will interchangeably use substrates with studs on one side (device-side only) or on both, device side and the printed wiring board (PWB), or simply 'board side'.

Using these methods, the substrate with via studs can be fabricated for device packaging. A wide choice of LTCC compositions are available commercially-available for fabrication of the LTCC substrates of this invention. In our preferred approach, a MgO—Al2O3_SiO2 glass composition, having MgO in the range of 15-28% by weight, Al2O3 in the range of 9-15% by weight, the remainder being silica, except for less than 2% of nucleating agents such as TiO2, ZrO2, P2O5, or B2O3. The glass powder of this composition fully densifies and crystallizes in the temperature range of 850 C to 950 C, thereby co-sintering with thick film silver or copper pastes. Furthermore, the resulting ceramic has a dielectric constant of about 5, which is very good for packaging application. It has the additional benefit of having thermal expansion coefficient closely matched to that of silicon.

Monolithic Substrate for Packaging and Probing:

Space transformers with studs can be made either in a multi-up or multichip configuration. Multichip packages, can have shared circuitry, and are used as such for mounting several different types of chips to obtain a subsystem. In the multi-up configuration, a contiguous array of chip size space transformers having the same size and positional relationships as the devices on the corresponding product wafer, are formed for possible use as a wafer-scale contactor. Such a multi-up space transformer can also be diced to many chip-size space transformers, to be later re-assembled into multi-Device Under Test, multi-DUT, contactors, as described later. Each transformer in a multi-DUT space transformer is a distinct unit with no shared circuitry. Multi-up substrates form the basis for the embodiments of this invention.

Figure 5:
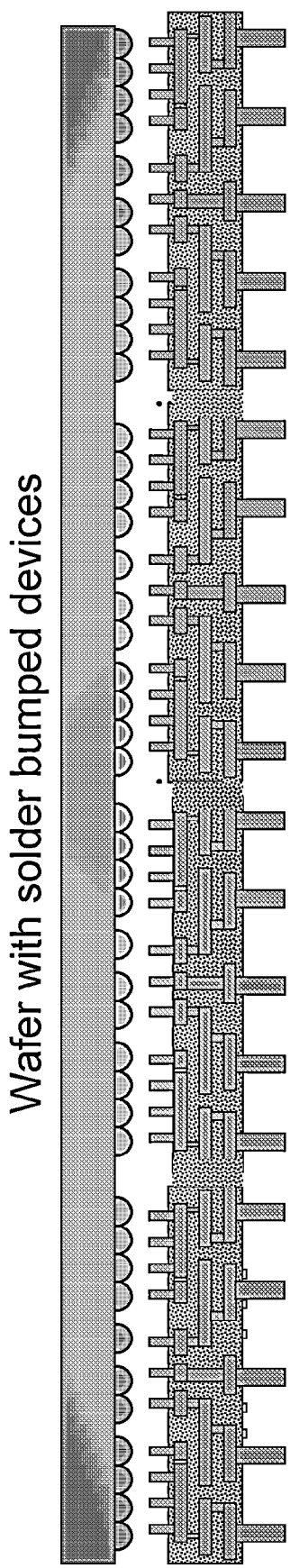
FIG. 5 illustrates an exemplary full wafer flip chip, assembled on monolithic full wafer stud substrate.

When the entire wafer is permanently assembled to the wafer-sized monolithic substrate as shown in FIG. 5, the I/O pads on the opposite side of the substrate, which are less numerous, larger, and much more widely spaced, can be accessed for electrical testing, and even burn-in. It is obvious, that such a scheme for permanently attaching an entire device wafer to a substrate can only be useful when the device technology is stable, and device yields are high, and there is room for significant redundancies in the number of devices good when needed in the application. For full wafer flip chip process, the whole wafer is assembled on monolithic full wafer stud substrate, with the package outline fitting within the dicing lanes on the wafer.

When a substrate with studs is permanently attached to a semiconductor device for packaging by a flip chip solder method, the elongated studs provide considerable mechanical flexibility to the interconnection, and thereby help to enhance its fatigue life. This is analogous to the so-called copper bump technology that has been introduced by leading semiconductor makers to accomplish the same, at considerably lower cost than the latter.

The monolithic wafer- size, multi-up substrate assembly shown in FIG. 5, can also be used solely for performing wafer-scale testing, and burn-in, if the solder attachment can be designed to be easily re-workable. One way to enable this is to limit the attachment area of the solder on top of the I/O studs on the package. A method for restricting the solder attach area is to place a polymer sheet with small holes drilled in it that correspond accurately to the I/O layouts of the devices across the entire wafer. The size of these holes are made to be just large enough to allow for easy solder penetration and coalescence of molten solder from both sides and, yet be small enough to easily and predictably separate the wafer from the package without significantly changing the solder balls on either. High temperature polyimide is an appropriate material for separation sheet in this use.

The probe assembly of FIG. 5 can also be used to make electrical connection to the test pads on a wafer though compliant z-axis connectors. Here, the normally non-conductive connector sheet will become locally conductive at points where the probes press on it against the wafer. Many other types of commercially available z-axis conductors can be used in the place of the Fujitsu material cited as an example above.

The monolithic wafer-scale-package with studs of FIG. 5 can also be used solely as a monolithic wafer-scale contactor for directly contacting the device terminals on the product wafer. Here the studs are brought only into physical contact with the terminals on the wafer, in a 'wafer tester'.

Figure 6:
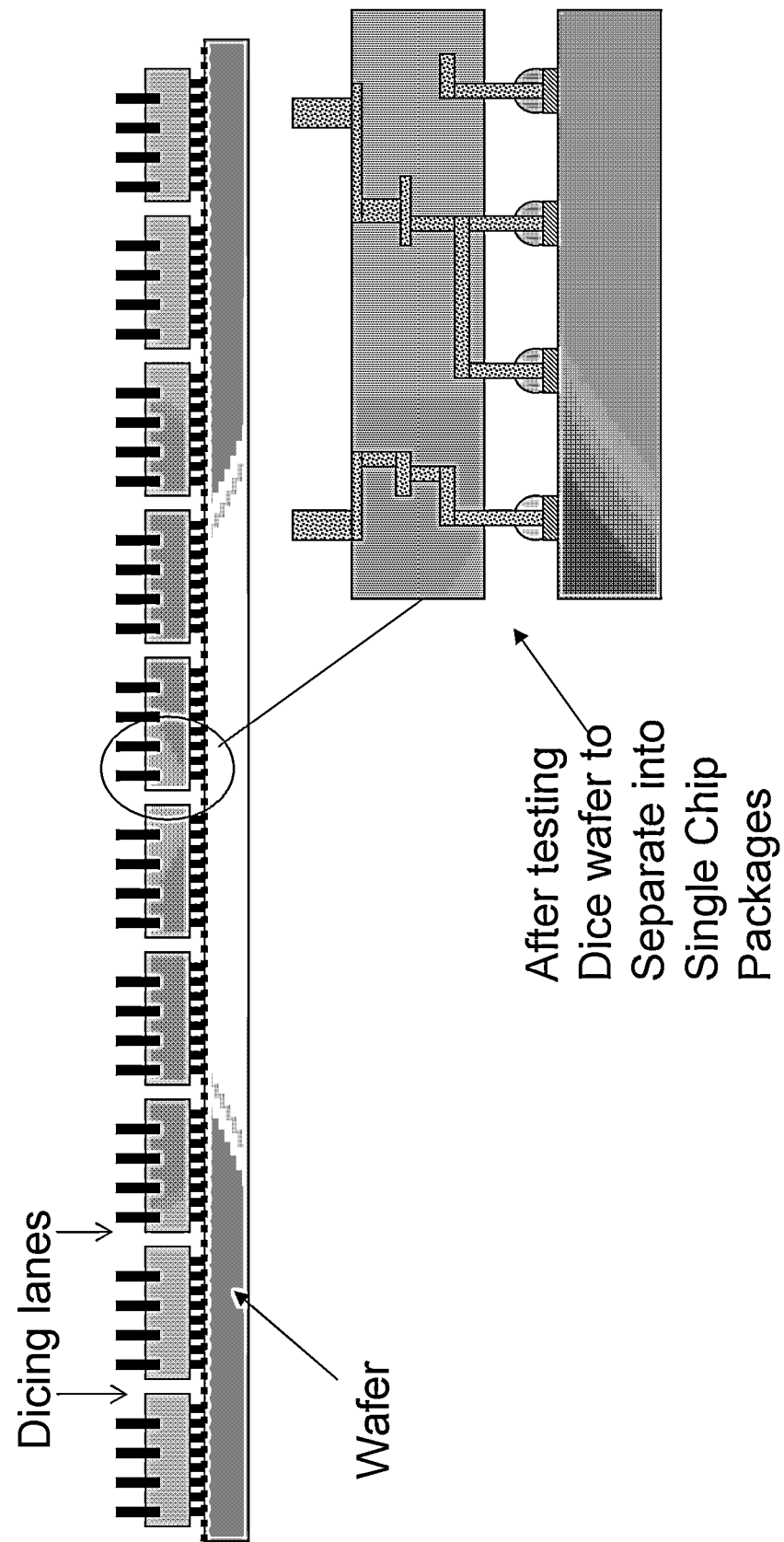
FIG. 6 illustrates an exemplary wafer-level assembly of chip stud package.

Assembled Packages and Probe:

Another way to accomplish the wafer level assembly for testing, burn-in and packaging, is to attach individual device-size space transformers of this invention, on to wafer by flip chip methods. The packages should be small enough to fit well within the dicing lines on the wafer. The self-aligning ability of such flip chip attachment enables accurate placement and assembly by using screen printed solder and metal stencils for packages to be dropped in, and reflow bonding of the packages over the entire wafer. When thus joined, the I/O terminals of the packages on the board side can be easily accessed for device testing and burnin, prior to dicing the packaged devices. Here, the individual device-size packages are tested, burnt-in, diced and shipped, as packaged dies. Such a packaging and assembly scheme is illustrated in FIG. 6.

Figure 7:
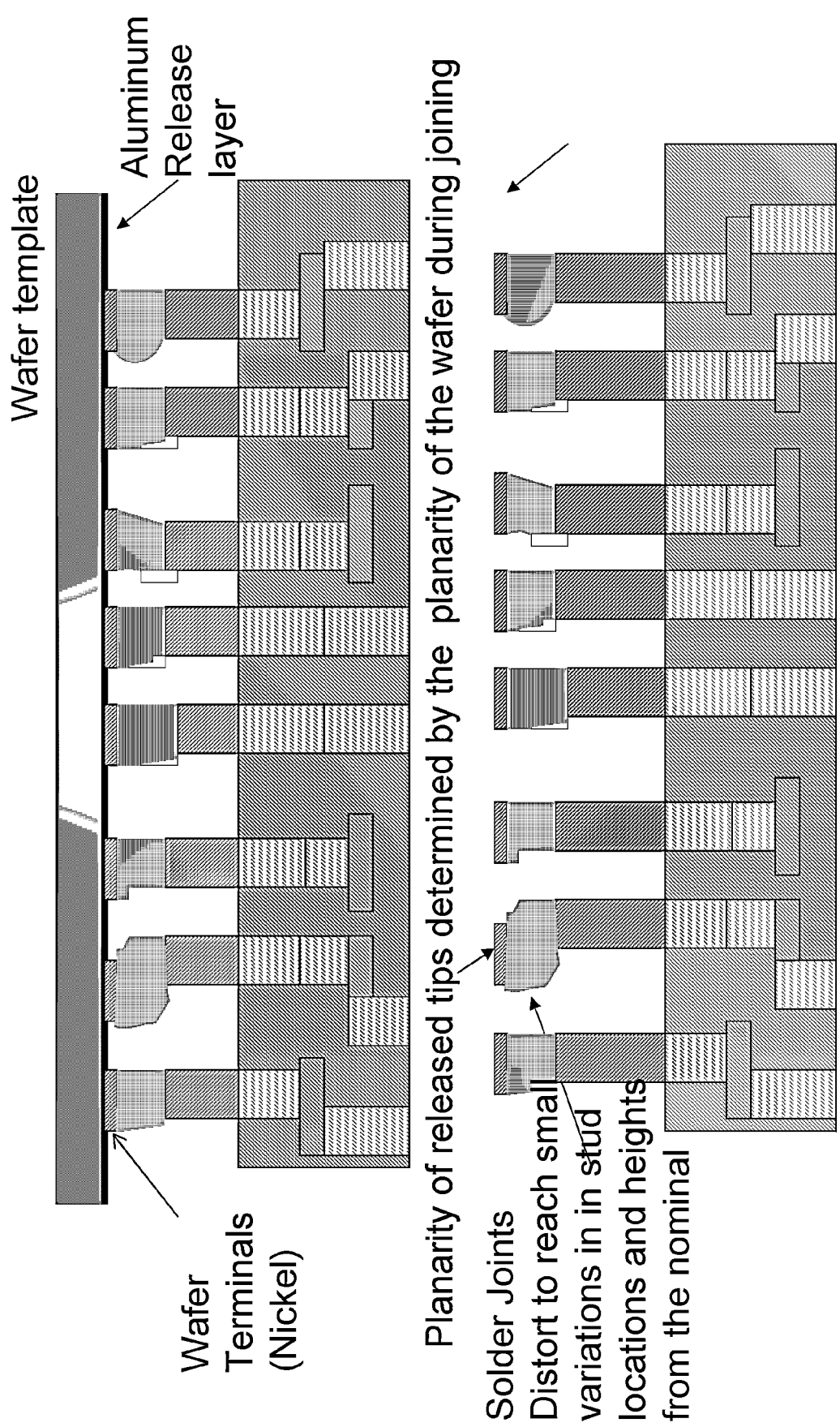
FIG. 7 illustrates an exemplary self-aligning flip-chip attached to wafer template, followed by wafer removal.

In a preferred method for forming an assembled wafer-scale-contactor, the single-chip size stud substrates are carefully assembled to obtain a multi-DUT wafer probe, using a wafer template having metal terminals identical to those on the product wafer, on a sacrificial metal layer. The terminal pads on the wafer template are fabricated on a sacrificial metal layer of aluminum. The wafer terminal pads will be at their correct nominal locations. However, the tips of the stud may be displaced from their correct lateral positions by small amounts. Here, the well known self-aligning characteristic of the flip-chip solder bonding comes to play and corrects small variations in x-y and z positional locations of the studs. The solder columns distort in shape to reach terminal pads on the wafer from slightly misaligned studs, as illustrated in FIG. 7. The planarity of the chip terminal pads is assured by holding the wafer flat against a flat wafer chuck during solder reflow. After such assembly, the space transformer array is captured by potting in suitable material, such as epoxy, before being released from the template by dissolving the sacrificial metal layer. Such an assembled multi-DUT probe is illustrated in FIG. 8A. Also shown for comparison in FIG. 8B is a prior art multi-DUT probe assembly, assembled using many individual single-chip ceramic packages, each smaller than the size of the devices, where the coplanar thin film metal pads, typically 10 μm or less in height, are used as the contacting probes. To achieve reliable contacting of the device test pads, these thin film pads should have extra-ordinary co-planarity. To achieve this, the single-chip packages are painstakingly assembled on to a specially constructed mechanical support and potted in place with a potting compound. The other shortcoming is the reliance on purely mechanical means to assure 'probe' planarity.

The fabrication of LTCC substrates with integral via studs, described previously, can also be extended to provide, co-fired, sintered tips, with the required positional accuracy, together with required tip shapes as follows. The green LTCC laminate with the top bottom inert contact layers containing vias filled with metal pastes that form the studs, are usually fired on ceramic setter tiles. Here, in this embodiment, the setter tile is replaced by a silicon wafer template provided with shaped dimple arrays at locations corresponding to the terminals of the device wafer to be tested. These dimples are filled with suitable metal paste, the same one used to form the stud, i.e. copper, silver, or gold. Next the green (i.e. unfired) LTCC laminate, with contact layer, is placed in good alignment between the stud locations and these tip arrays on the wafer template, using an alignment aligning fixture. The green laminate is then sintered, as usual, to density the LTCC ceramic and the metal interconnects. During sintering, lateral shrinkage of the laminate is completely suppressed, and the entire densification is accommodated by the shrinkage in the thickness direction. During this process, the paste-filled dimples in the silicon wafer template also density to form shaped tips, and attach themselves to ends of the studs in the inert tape layers. The sintered laminate is released, and the inert ceramic powders of the contact layers are removed by washing or blowing off. Since the wafer template does not shrink laterally during sintering, the locations of the tips are fixed. Also the flat wafer template assures both positional accuracy and co-planarity of the tips. The methods to form accurately shaped and sized dimples in the wafer template is by anisotropic etching though a resist pattern is well known in the art. This typically produces pyramid-shaped tips (FIG. 9).

Figure 10:
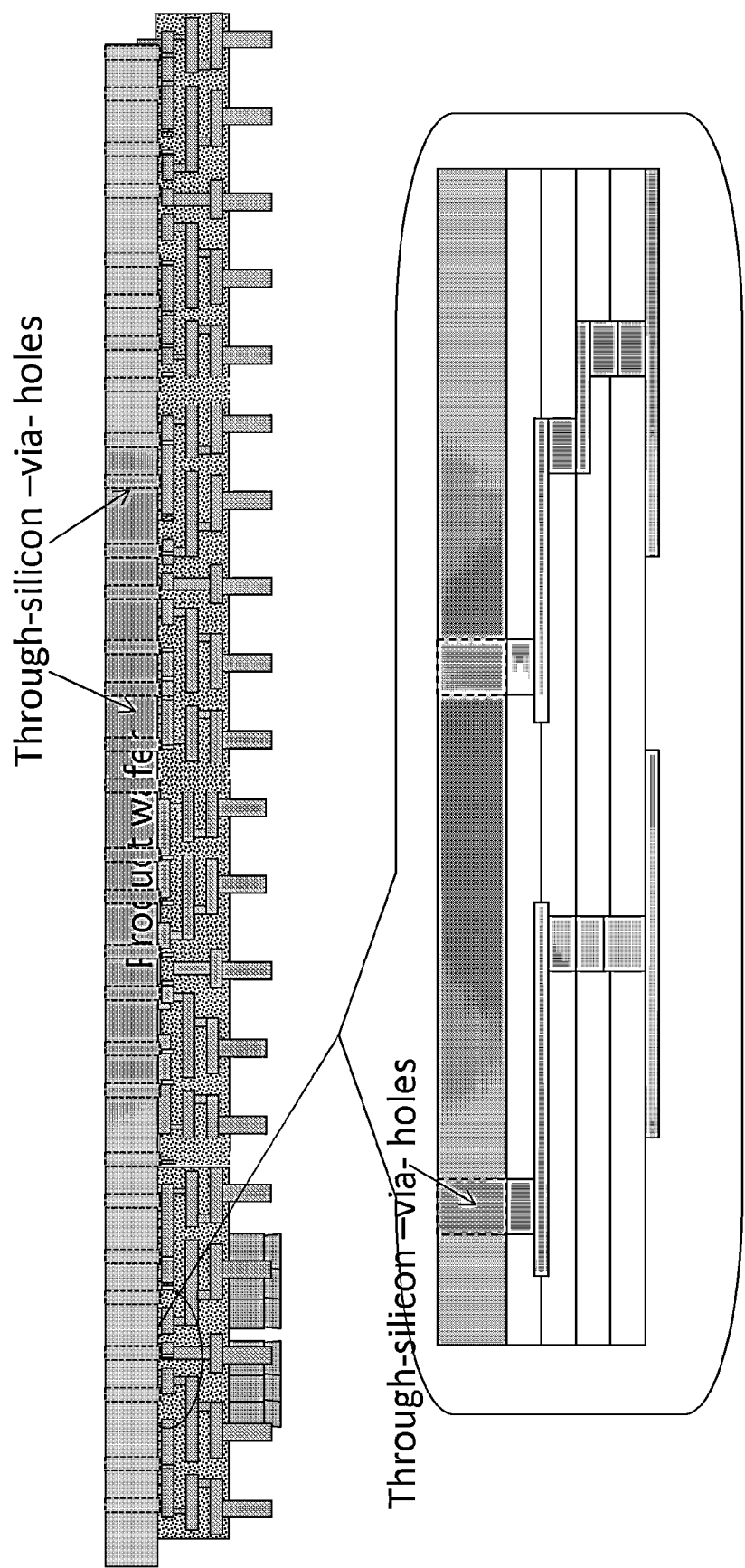
FIG. 10 illustrates a ceramic space transformer formed in-situ on a product wafer by aligning, attaching, and firing on a wafer size green laminate. The devices on the wafer can be tested at wafer level, or diced into die-sized packages for testing.

FIG. 10 illustrates a further embodiment of this invention. Here, the wafer template of the above example is replaced by a un-processed wafer, i.e. one without devices fabricated thereon. Here the un-processed product wafer is first provided with though-silicon-via holes to enable later electrical connection to device terminals to be fabricated subsequently on the wafer-side of ceramic-wafer composite. The green ceramic laminate with thick film silver metallization paste circuit pattern throughout, including silver paste-filled vias on both sides is prepared with a co-laminated contact sheet on the 'board-side' only, is also prepared separately. The green laminate thus prepared is placed on the previously prepared un-processed wafer such that the vias filled with silver paste on the 'device side' of the laminate are in good alignment with the corresponding though-silicon via holes, and pressed thereon at moderate temperature and pressure. The wafer-laminate assembly is then cured at the required high temperature to consolidate the ceramic dielectric and the silver conductor features. The contact sheet on one side and the solid wafer on the other, act to eliminate any lateral shrinkage in relatively thin laminates, thus preserving the location accuracy of the circuit features. During this consolidation, the ceramic dielectric strongly bonds to the oxidized surface of the silicon wafer forming in-effect, a silicon-on-insulator or SOI wafer with built-in through-silicon-via holes, and an integral ceramic interconnect structure. The SOI wafer is then used to fabricate desired semiconductor devices thereon, including through-silicon-via interconnections, to the silver pads on the integral package, by methods known to the industry. This scheme will provide a very economical means for wafer-level testing and packaging. To successfully accomplish this in-situ substrate fabrication, the starting glass in ceramic composition should densify and adhere well to the oxidized silicon surface, and posses a coefficient of thermal expansion well matched to that of silicon. $MgO-Al_2O_3-SiO_2$ glasses cited earlier, have these attributes This also accomplishes several major objectives of Intel Corporation's so-called, "Bumpless Bonding Build-Up Laminate (BBUL")" structure (Towle and Wermer, U.S. Pat. No. 6,555,906), on a wafer-level, elegantly and economically.

Figure 11:
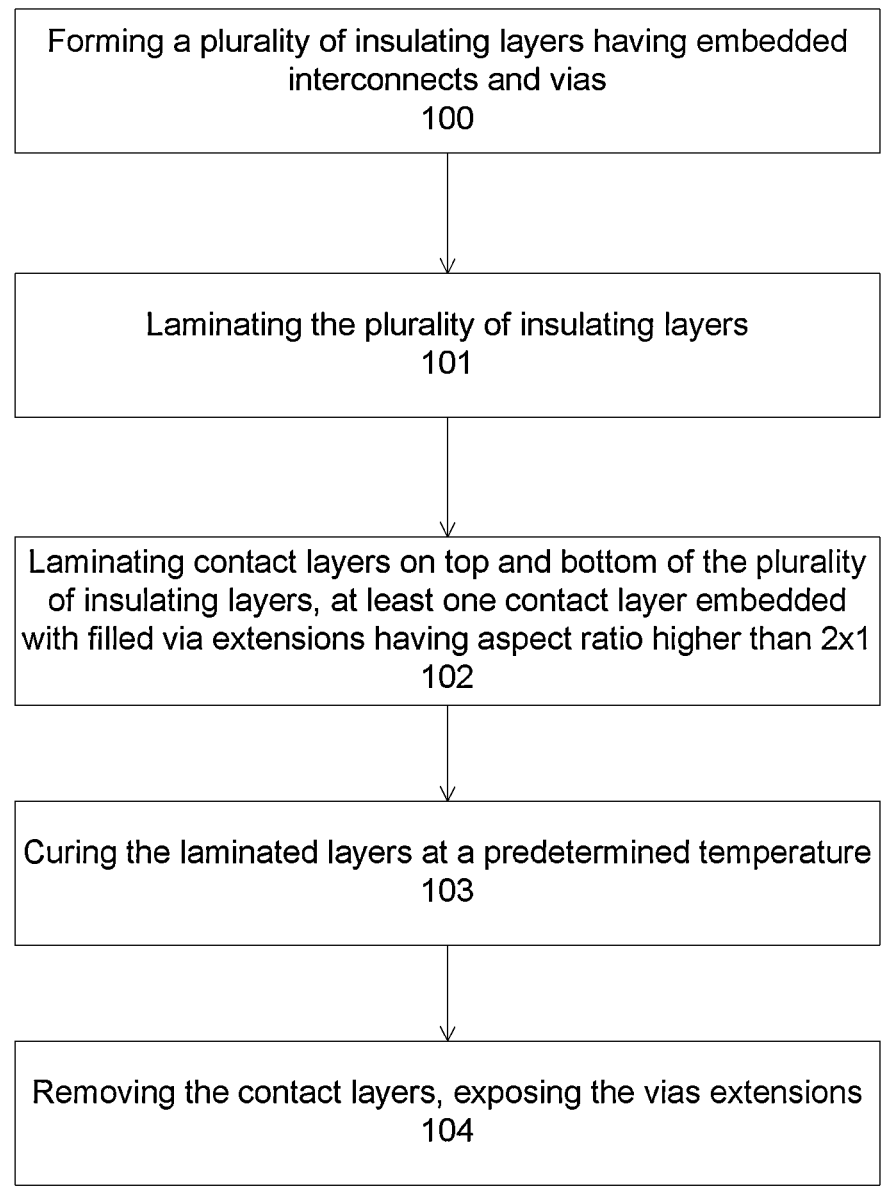
FIGS. 11 and 12 illustrate an exemplary process flow for forming a contactor according to embodiments of the present invention.
Figure 12A:
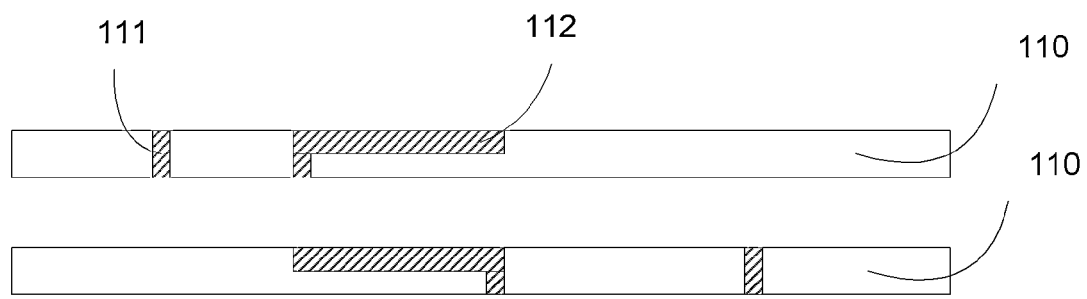
Figure 12B:
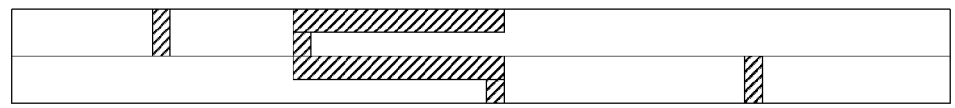
Figure 12C:
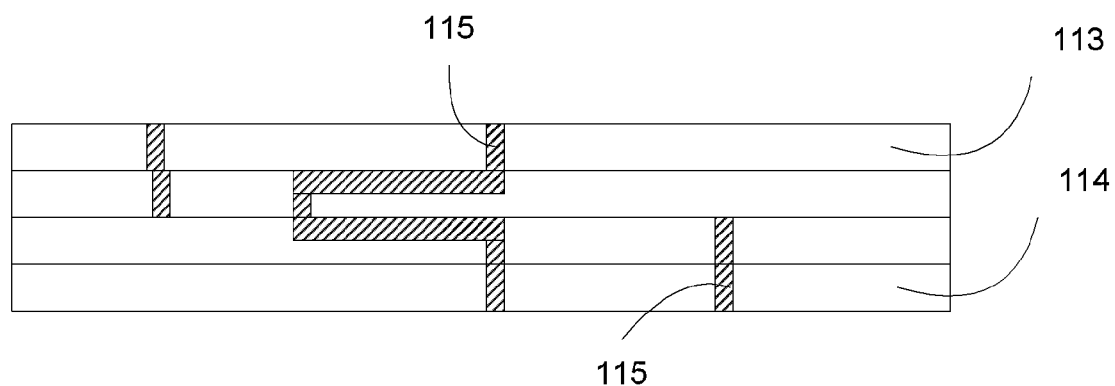
Figure 12D:
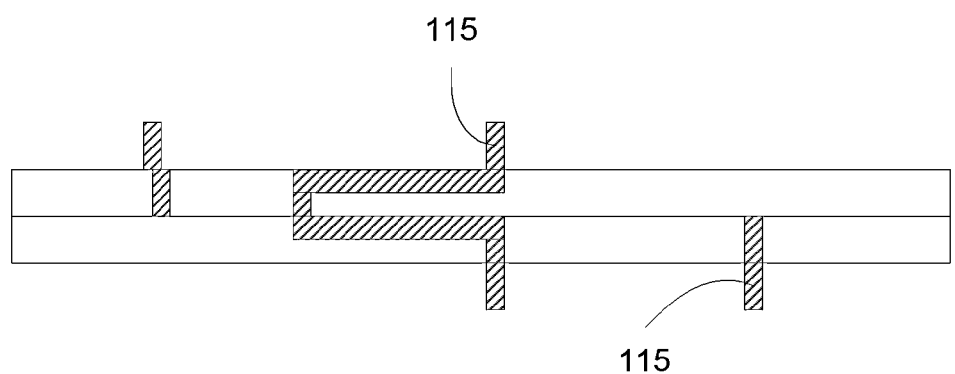

FIGS. 11 and 12 illustrate an exemplary process flow for forming a contactor according to embodiments of the present invention. Operation 100 forms a plurality of insulating layers having embedded interconnects and vias (FIG. 12A). The insulating layers 110 can be ceramic green sheets, with conductive lines 112 for interconnects, and filled punched holes 111 for vias. Operation 101 laminates the plurality of insulating layers together with proper alignment (FIG. 12B). Operation 102 laminates a contact layer on top and a contact layer on the bottom of the plurality of insulating layers (FIG. 12C). At least one contact layer 113 or 114 has embedded via extension patterns 115, which are filled with conductive material and have aspect ratio higher than 2×1. The high aspect ratio can be accomplished with small via size to accommodate the bond pads of the chip. Operation 103 cures the layers at a predetermined temperature. The insulating layers are solidified with certain degrees of shrinkage. The contact layers does not shrink, but converted to powder. Operation 104 removes the powdered contact layers, exposing the via extensions (FIG. 12D).

Figure 13:
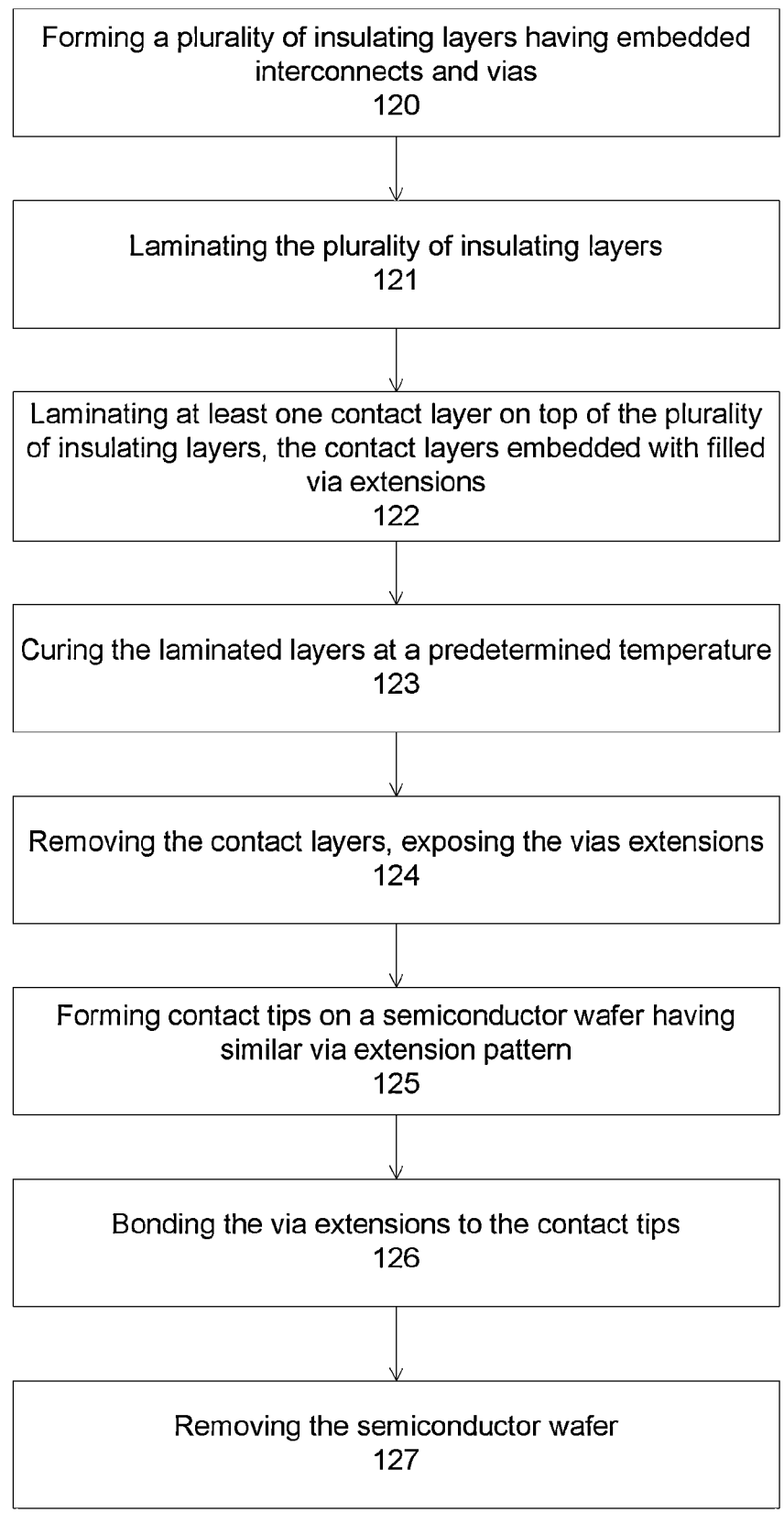
FIGS. 13 and 14 illustrate an exemplary process flow for forming a contactor with contact tips fabricated from a semiconductor wafer.
Figure 14A:
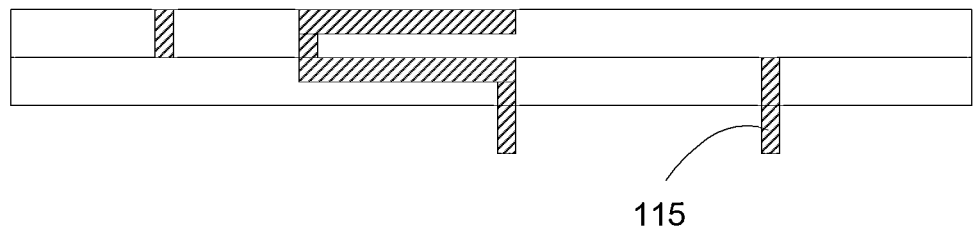
Figure 14B:
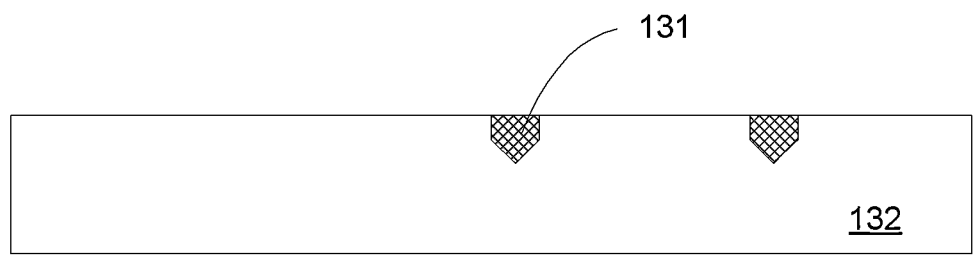
Figure 14C:
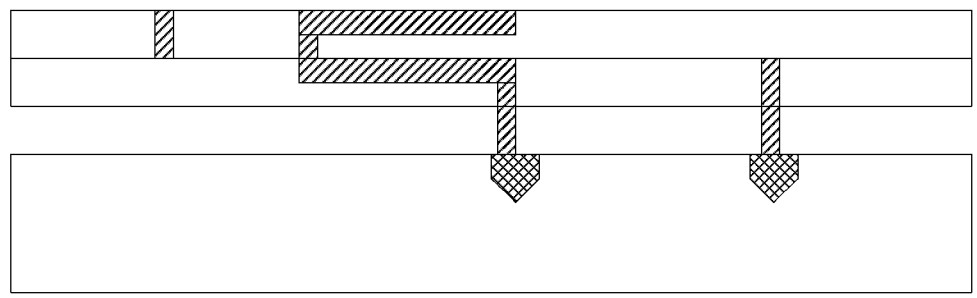
Figure 14D:
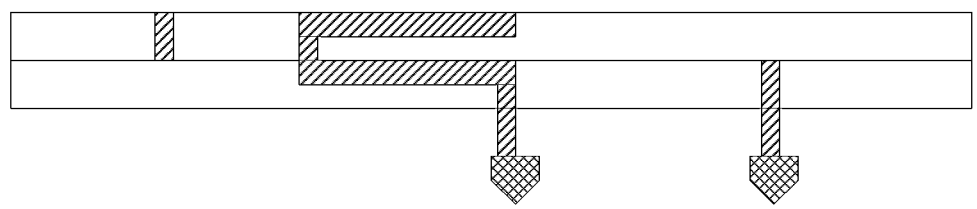

FIGS. 13 and 14 illustrate an exemplary process flow for forming a contactor with contact tips fabricated from a semiconductor wafer. Operations 120-124 form the contactor with exposed via extension, wherein the contactor can have one or two contact layers with filled via extensions 115 (FIG. 14A). The aspect ratio of the filled via extensions is preferably higher than 2×1, but in general can be any value. Operation 125 forms contact tips on a semiconductor wafer 132 with similar via extension patterns 131 (FIG. 14B). The planarity of the contact tips is thus determined by the flatness of the semiconductor wafer, allowing an accuracy in planarity of the contactor suitable for semiconductor device testing. The process of the contact tips can be performed by semiconductor processing, thus provides lateral dimensions, and lateral accuracy, of semiconductor processing, similar to that of the bond pads of semiconductor devices. Operation 126 bonds the via exensions 115 to the contact tips 131 (FIG. 14C). The bonding can be performed by soldering, with potential misalignment correction as discussed above. Operation 127 removes the semiconductor wafer from the contactor, forming a contactor having contact tips with planarity and lateral accuracy of semiconductor processing (FIG. 14D), suitable for matching the bond pads of semiconductor devices in testing.

Figure 15:
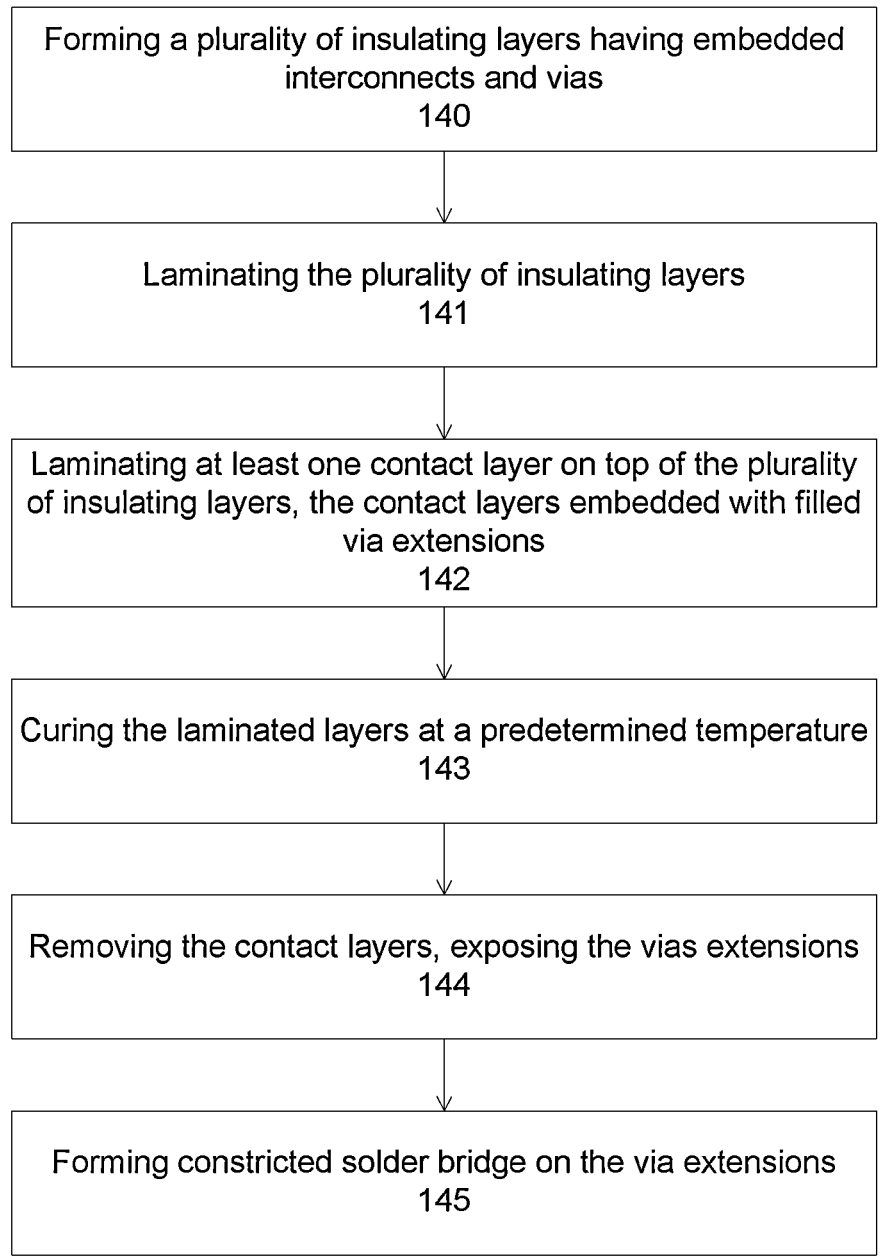
FIGS. 15 and 16 illustrate an exemplary process flow for forming a contactor with constricted solder bridge.
Figure 16A:
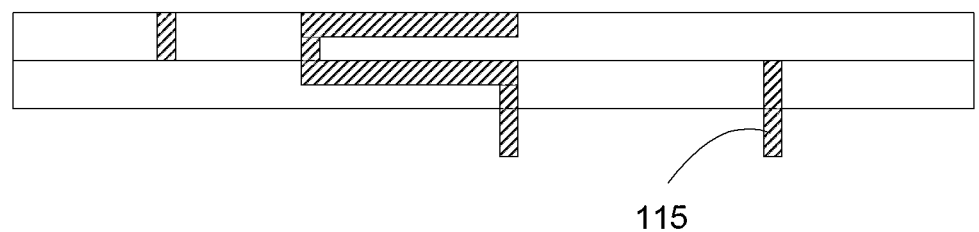
Figure 16B:
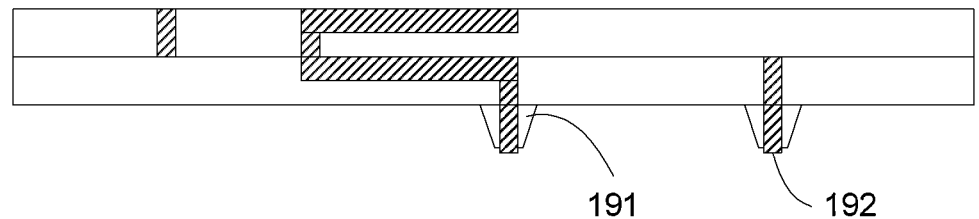

FIGS. 15 and 16 illustrate an exemplary process flow for forming a contactor with constricted solder bridge. Operations 140-144 form the contactor with exposed via extension, wherein the contactor can have one or two contact layers with filled via extensions 115 (FIG. 16A). The aspect ratio of the filled via extensions is preferably higher than 2×1, but in general can be any value. Operation 145 forms a constricted solder bridge 191 on the via extension 115 (FIG. 16B). In an aspect, the constricted solder bridge 191 limits the soldering surface of the via extension 115, for example, protecting the side surfaces from being soldering, and allowing only the top surface 192 to be soldered.

Figure 17A:
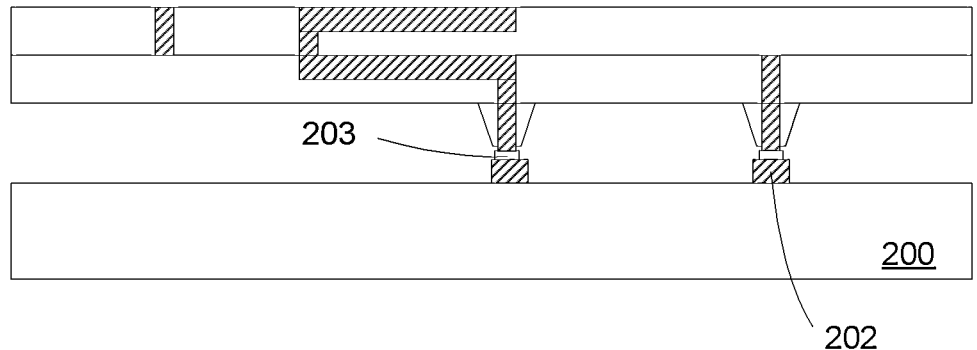
FIGS. 17A-17C illustrate an exemplary rework process for bonding a contactor with constricted solder bridge to a temporary substrate.
Figure 17B:
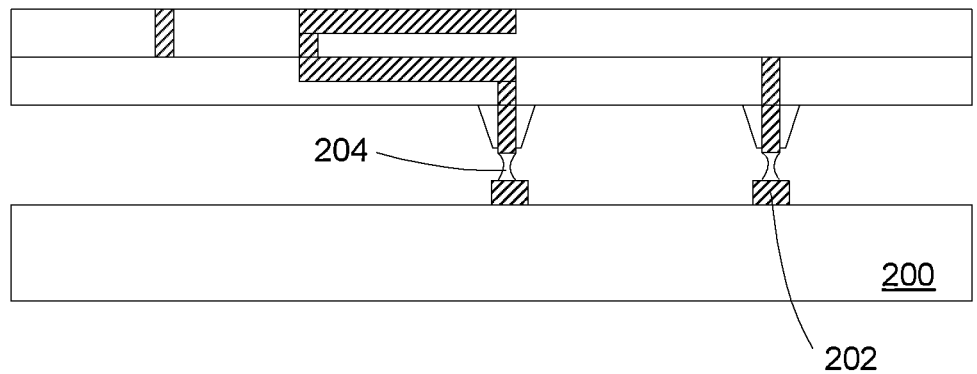
Figure 17C:
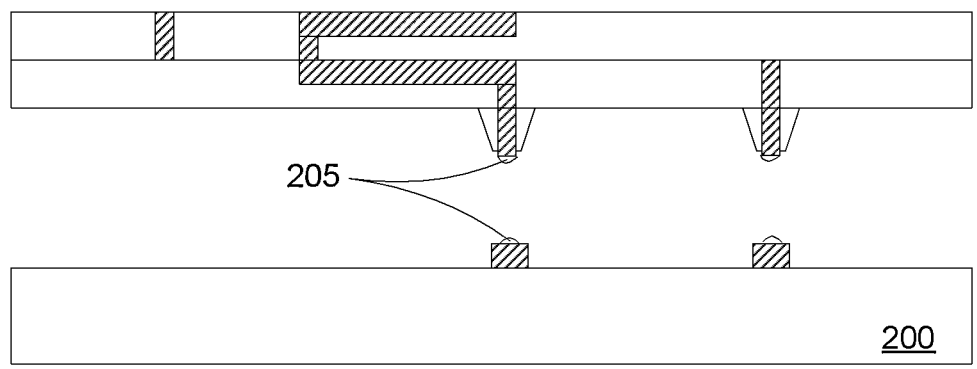

FIGS. 17A-17C illustrate an exemplary rework process for bonding a contactor with constricted solder bridge to a temporary substrate. The substrate 200 (for example, a semiconductor chip) has bond pads 202 for accessing internal devices. A contactor is bonded to the bond pads with solder 203 bonding with the constricted solder bridge. After finish testing the chip, the contactor is removed. Under heated environment, such as heating the contactor, the solder is reflow and the contactor can be pulling out of the chip. Since the bonding between the via extensions and the bond pads is restricted, the solder 204 can be broken off, and separated into residues 205.

Figure 18:
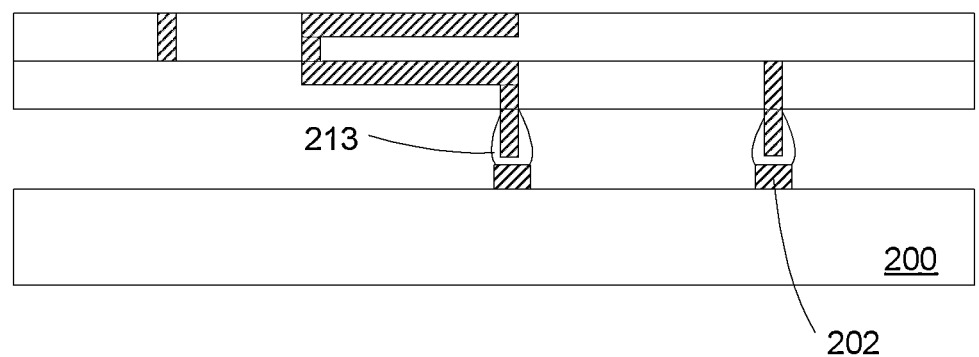
FIG. 18 illustrates an exemplary bonding for un-constricted via extensions.

FIG. 18 illustrates an exemplary bonding for un-constricted via extensions. Without the constricted solder bridge, the solder can bond 213 to the top and side surfaces of the via extensions, forming a permanent bonding between the bond pads 202 of the chip 200 with the contactor.

Figure 19:
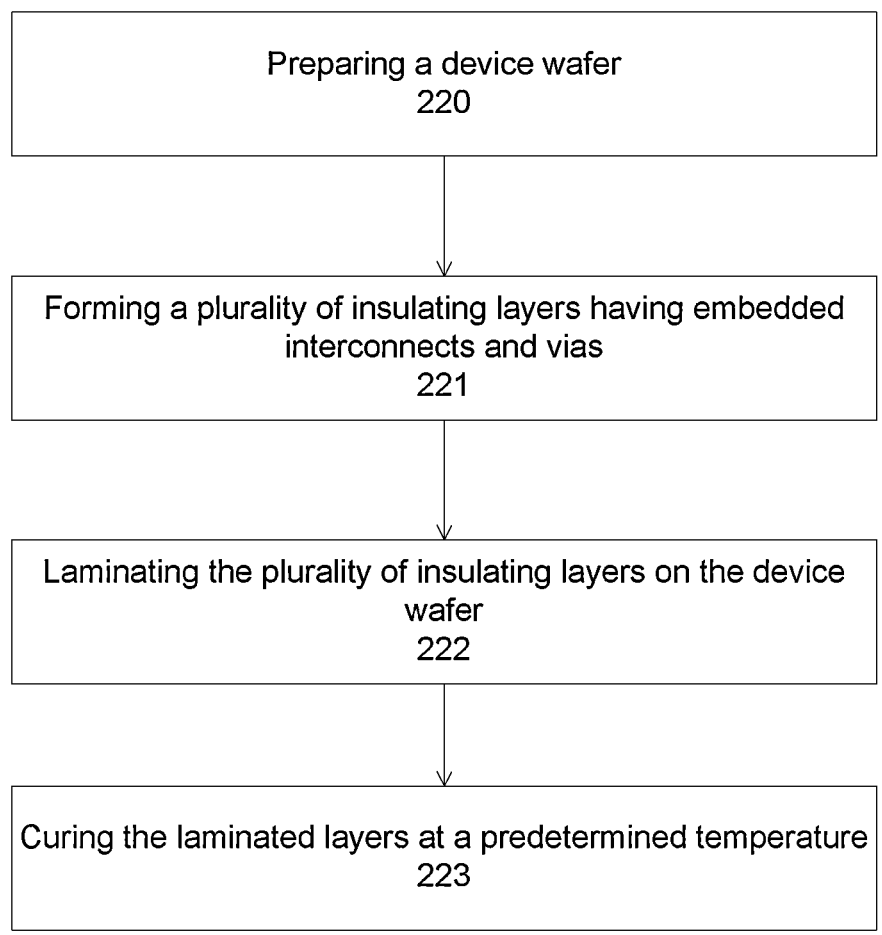
FIG. 19 illustrates an exemplary embodiment of the present integrated contactor on semiconductor wafer.

FIG. 19 illustrates an exemplary embodiment of the present integrated contactor on semiconductor wafer. Operation 220 prepares a semiconductor wafer, for example, with devices and interconnections. Operation 221 forms a plurality of insulating layers with embedded interconnects and vias. Operation 222 laminates a plurality of insulating layers on the device wafer, and operation 223 cures the laminated layers and the wafer at a predetermined temperature. This process forms an integrated wafer package, complete with a contactor on a semiconductor wafer. The wafer can then be tested and/or diced into individual chips.

What is claimed is:

1. A method for forming a contactor, comprising:
    laminating a plurality of insulating layers with embedded interconnects and vias connecting within, wherein the plurality of insulating layers comprise ceramic powders that can soften and flow upon curing at temperatures below 1000 C;
    laminating contact layers on top and bottom of the plurality of insulating layers, the contact layers embedded with filled via extension patterns having higher than 2×1 aspect ratio, wherein the contact layers comprise inert ceramic powders that do not densify and remain in powder form upon curing at the temperatures below 1000 C;
    printing a cantilever part of a cantilever structure on a surface of the contact layers;
    connecting the cantilever part to a stud via of the contact layers, wherein the cantilever part and the stud via are configured to form the cantilever structure after the contact layers are removed;
    curing the laminating layers at a temperature between 800 and 1000 C; and
    blowing on the contact layers for removing the cured contact layer, exposing the via extension patterns and the stud via.

2. A method as in claim 1 wherein at least an insulating layer of the insulating layers comprises a ceramic layer with conductive pastes for forming the interconnects within a layer and vias for layer-to-layer interconnections.

3. A method as in claim 1 wherein the inert ceramic powders of the contact layers prevent shrinkage in lateral dimensions.

4. A method as in claim 1 wherein the contact layers become powder after curing.

5. A method as in claim 1 wherein the plurality of insulating layers comprise alumina with a volume fraction of glasses that soften and flow upon curing at the temperatures below 1000 C.

6. A method as in claim 1 wherein the contact layers comprise alumina with alumino-silicate glasses that sinter at temperatures above 1400 C.

7. A method as in claim 1 wherein blowing on the contact layers comprises blowing with jets of air or of water.

8. A method as in claim 1 wherein the height of the filled via extension patterns is between 50 and 250 microns.

9. A method as in claim 1 wherein more than one contact layers are laminated on top or bottom of the plurality of insulating layers.

10. A method as in claim 9 further comprising
    displacing the filled via extension patterns in the more than one contact layers to achieve staggered stud structures.

11. A method for forming a contactor, comprising:
    laminating a plurality of insulating layers with embedded interconnects and vias connecting within, wherein the plurality of insulating layers comprise ceramic powders that can be sintered upon curing at a first temperature;
    laminating contact layers on top and bottom of the plurality of insulating layers, the contact layers embedded with filled via extension patterns, wherein the contact layers comprise inert ceramic powders that remain in powder form upon curing at the first temperatures;
    curing the laminating layers at the first temperature;
    removing the cured contact layer, exposing the via extension patterns;
    printing a cantilever on a surface of the contact layers; and
    connecting the cantilever to a stud via of the contact layers to achieve a cantilever structure.

12. A method as in claim 11 wherein the first temperature is between 800 and 1000 C.

13. A method as in claim 11 wherein upon curing at the first temperature, the plurality of insulating layers become densified while the contact layers become a loose agglomeration of inert ceramic powder.

14. A method as in claim 11 wherein the cured contact layers are removed by blowing on the contact layers with jets of air or of water.

15. A method as in claim 11 wherein the filled via extension patterns have higher than 2×1 aspect ratio.

16. A method for forming a contactor, comprising:
- laminating a plurality of insulating layers with embedded interconnects and vias connecting within, wherein the plurality of insulating layers comprise ceramic powders that can be sintered upon curing at a first temperature;
- laminating contact layers on top and bottom of the plurality of insulating layers, the contact layers embedded with filled via extension patterns, wherein the contact layers comprise inert ceramic powders that remain in powder form upon curing at the first temperatures;
- printing a cantilever part on a surface of the contact layers;
- connecting the cantilever part to a stud via of the contact layers, wherein the cantilever part and the stud via are configured to form a cantilever structure after the contact layers are removed;
- curing the laminating layers at the first temperature; and
- removing the cured contact layer, exposing the via extension patterns.

17. A method as in claim 16 wherein the first temperature is between 800 and 1000 C.

18. A method as in claim 16 wherein upon curing at the first temperature, the plurality of insulating layers become densified while the contact layers become a loose agglomeration of inert ceramic powder.

19. A method as in claim 16 wherein the cured contact layers are removed by blowing on the contact layers with jets of air or of water.

20. A method as in claim 16 wherein the filled via extension patterns have higher than 2×1 aspect ratio.

\* \* \* \* \*